US006295445B1

(12) United States Patent
Uesugi (10) Patent No.: US 6,295,445 B1
(45) Date of Patent: Sep. 25, 2001

(54) AUTOMATIC GAIN CONTROLLING METHOD, AUTOMATIC GAIN CONTROLLING APPARATUS, AND COMMUNICATION RECEIVING APPARATUS

(75) Inventor: Hiroyuki Uesugi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/340,436

(22) Filed: Jun. 28, 1999

(30) Foreign Application Priority Data

Jun. 29, 1998 (JP) .................................. 10-196501

(51) Int. Cl.[7] .................................................. H04B 1/40
(52) U.S. Cl. ................... 455/234.1; 455/232.1; 455/240.1; 455/245.1; 455/250.1; 375/345
(58) Field of Search ............................ 455/234.1, 232.1, 455/236.1, 239.1, 240.1, 245.1, 250.1, 251.1, 308, 309, 312, 313, 226.2, 226.4, 200.1, 214, 219, 136, 138; 375/345

(56) References Cited

U.S. PATENT DOCUMENTS 4,955,077 * 9/1990 Sugayama ......................... 455/234.1
5,517,518 * 5/1996 Morson et al. ...................... 375/200
5,884,152 * 3/1999 Matsumoto ....................... 455/234.1
5,987,071 * 11/1999 Iwamatsu et al. ..................... 455/61
6,002,925 * 12/1999 Vu et al. ............................. 455/313
6,038,435 * 3/2000 Zhang ............................... 455/234.1

FOREIGN PATENT DOCUMENTS 9-247113  9/1997 (JP) .
10-56343  2/1998 (JP) .

* cited by examiner

Primary Examiner—Lee Nguyen
Assistant Examiner—Simon Nguyen
(74) Attorney, Agent, or Firm—Foley & Lardner (57) ABSTRACT

An RF signal received from an antenna is supplied to an RF portion. The RF portion mixes down the RF signal to an IF signal. An RSSI circuit of an automatic gain controlling circuit portion converts the received RF signal into a DC component and detects the electric field intensity of the received signal. A level determining unit has two threshold values of the input level. The level determining unit controls the variable amount of a gain varying unit corresponding to the input level. An averaging process circuit averages a digital signal in a predetermined time period T and controls the variable amount of the gain varying unit 3 so that the average value converges at a digital value with n bits that represent a predetermined amplitude level. A BB portion demodulates the digital signal that has been modulated on the transmitting side to original information.

19 Claims, 5 Drawing Sheets

AUTOMATIC GAIN CONTROLLING METHOD, AUTOMATIC GAIN CONTROLLING APPARATUS, AND COMMUNICATION RECEIVING APPARATUS

BACKGROUND OF THE INVENTION

1. Field of the Invention

The present invention relates to an automatic gain controlling method for controlling the variable amount of the gain according to the level of the received signal using an RSSI (Receive Signal Strength Indicator) that detects the electric field intensity of the received signal so as to convert the received signal as an analog signal into a digital signal. The present invention also relates to an automatic gain controlling apparatus corresponding to the automatic gain controlling method and a communication receiving apparatus having the automatic gain controlling apparatus.

2. Description of the Related Art

A conventional receiving apparatus for use with a radio communication system performs an automatic gain controlling process corresponding to the fluctuation of the level of the received signal.

In for example a CDMA mobile communication system of which a plurality of users use the same frequency, an RSSI that detects the electric field intensity of the received signal is used to control the variable amount of a gain varying unit disposed in a receiving apparatus so as to keep the level of a signal that is supplied to an analog/digital (A/D) converting unit.

Figure 1:
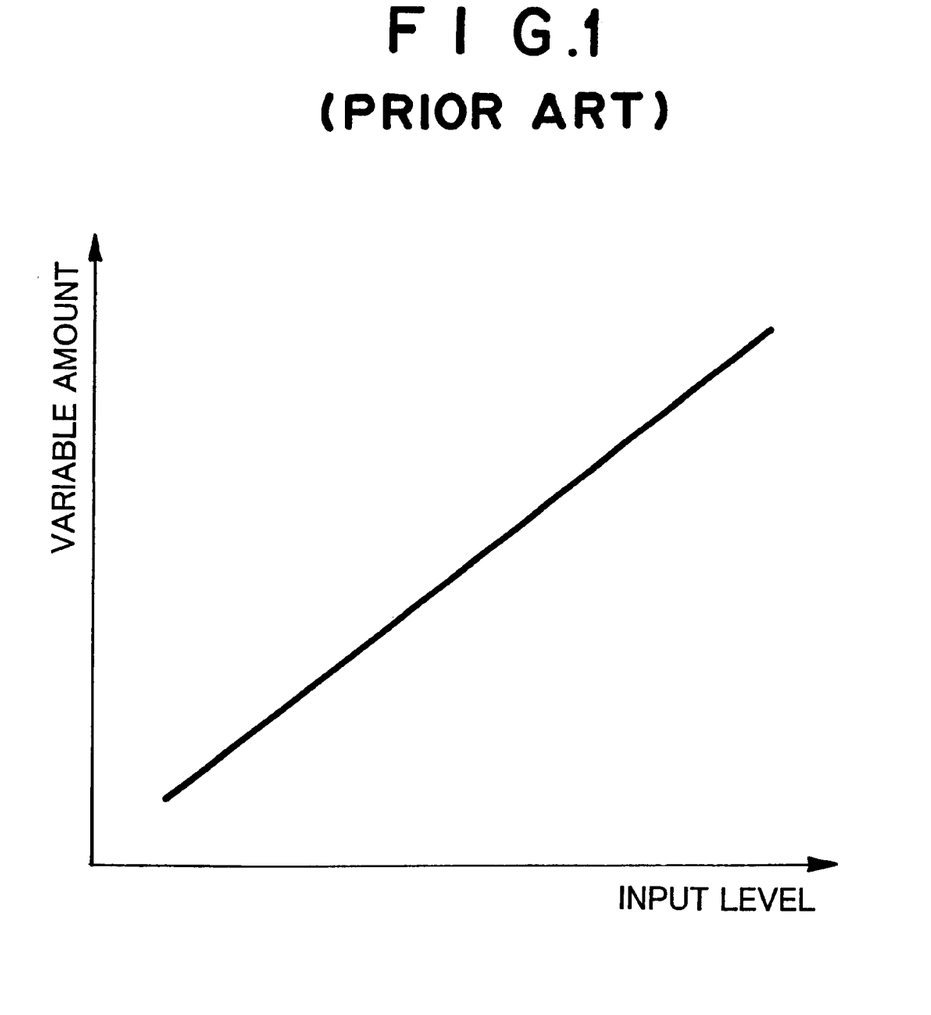
FIG. 1 is a graph showing the relation between the input level and the variable amount of a conventional RSSI.

However, in the conventional radio communication receiving apparatus, as shown in FIG. 1, the RSSI controls the gain varying unit so that the variable amount thereof is proportional to the input level as the level of the received signal. Thus, since the variable amount of the gain varying unit is controlled corresponding to information of the preceding slot of the received signal. Consequently, when the level of the received signal largely fluctuates, the variable amount of the gain varying unit becomes excessive. As a result, the automatic gain controlling process may not properly operate corresponding to the abrupt fluctuation of the received signal for fading, shadowing and so like.

SUMMARY OF THE INVENTION

The present invention is made from the above-described point of view. An object of the present invention is to provide a gain controlling method that allows a received signal to be stable received level against the fluctuation of the level of the received signal. Another object of the present invention is to provide a gain controlling apparatus corresponding to the gain controlling method and a communication receiving apparatus having the gain controlling apparatus.

A first aspect of the present invention is an automatic gain controlling method for causing an RSSI (Receive Signal Strength Indicator) to detect the electric field intensity of a received signal supplied to a demodulating unit so as to control the variable amount of the gain of a radio frequency signal and output a signal in a predetermined level, the method comprising the steps of (a) detecting the electric field intensity of the received signal and controlling the variable amount of the gain corresponding to the detected electric field intensity, and (b) causing the demodulating unit to convert the received signal into the digital signal and controlling the variable amount of the gain so as to converge the average value of the converted digital signal at a digital signal in a predetermined amplitude level.

When the variable amount of the gain is controlled corresponding to the electric field intensity, the variable amount of the gain is almost constant in a predetermined level range of the received signal.

When the digital signal is averaged, a signal detected in each predetermined time period is converted into a digital signal within a predetermined number of bits corresponding to almost the same level.

The digital signals are averaged in a predetermined time period.

A second aspect of the present invention is an automatic gain controlling apparatus, comprising a gain varying unit for keeping a received signal in a predetermined level, an analog/digital converting unit for converting the signal kept in the predetermined level by the gain varying unit into a digital signal, an RSSI controlling portion for detecting the electric field intensity of the received signal and controlling the variable amount that causes the gain varying unit to vary the received signal in a predetermined level corresponding to the detected electric field intensity, and an averaging process circuit for averaging the level of the digital signal received from the analog/digital converting unit and controlling the variable amount that causes the gain varying unit to vary the signal in a predetermined level so as to converge the digital signal received from the analog/digital converting unit at a predetermined amplitude level.

The RSSI controlling portion has an RSSI circuit for detecting the electric field intensity of the received signal, and a level determining unit having at least one threshold value for setting a range of which the conversion amount of the gain is almost constant in a predetermined range of the electric field intensity detected by the RSSI circuit.

The averaging process circuit converts a signal detected in each predetermined time period into a digital signal within a predetermined number of bits corresponding to almost the same level and averages each of bits of the digital signals.

The averaging process circuit averages the number of bits of the digital signals in a predetermined time period.

A third aspect of the present invention is a communication receiving apparatus, comprising a radio frequency receiving portion for receiving a transmitted signal, an automatic gain controlling apparatus for converting the signal received from the radio frequency receiving portion into a digital signal, the automatic gain controlling apparatus having a gain varying unit for keeping a received signal in a predetermined level, an analog/digital converting unit for converting the signal kept in the predetermined level by the gain varying unit into a digital signal, an RSSI controlling portion for detecting the electric field intensity of the received signal and controlling the variable amount that causes the gain varying unit to vary the received signal in a predetermined level corresponding to the detected electric field intensity, and an averaging process circuit for averaging the level of the digital signal received from the analog/digital converting unit and controlling the variable amount that causes the gain varying unit to vary the signal in a predetermined level so as to converge the digital signal received from the analog/ digital converting unit at a predetermined amplitude level, and a base band portion for demodulating a digital signal that has been modulated on a transmitting side and received from the automatic gain controlling apparatus to original information.

The RSSI controlling portion has an RSSI circuit for detecting the electric field intensity of the received signal, and a level determining unit having at least one threshold value for setting a range of which the conversion amount of the gain is almost constant in a predetermined range of the electric field intensity detected by the RSSI circuit.

The averaging process circuit converts a signal detected in each predetermined time period into a digital signal within a predetermined number of bits corresponding to almost the same level and averages each of bits of the digital signals.

The averaging process circuit averages the number of bits of the digital signals in a predetermined time period.

These and other objects, features and advantages of the present invention will become more apparent in light of the following detailed description of a best mode embodiment thereof, as illustrated in the accompanying drawings.

DESCRIPTION OF PREFERRED EMBODIMENT

Next, with reference to the accompanying drawings, the structure of a communication receiving apparatus according to an embodiment of the present invention will be described.

Figure 2:
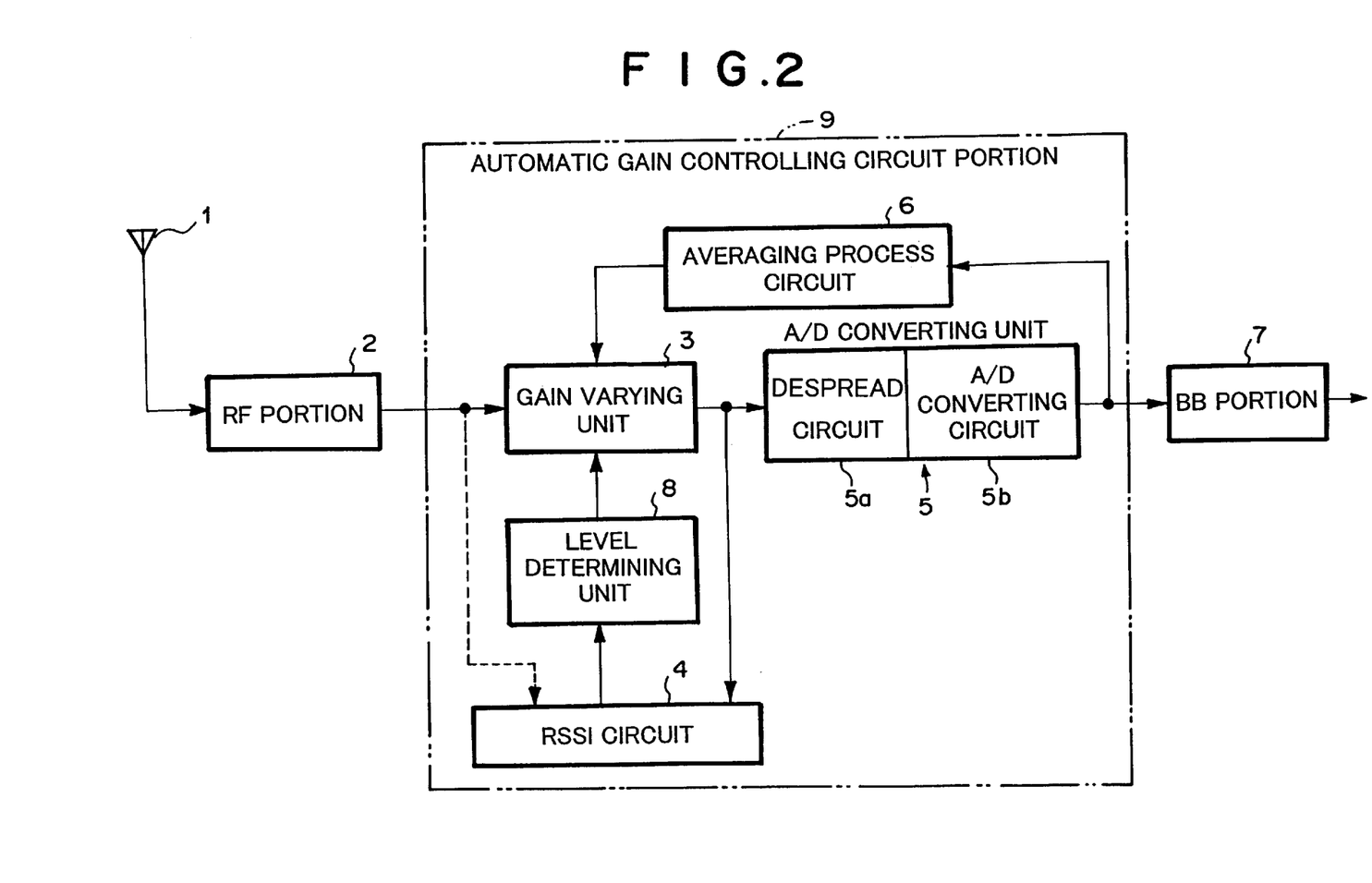
FIG. 2 is a block diagram showing the structure of a communication receiving apparatus according to an embodiment of the present invention.

FIG. 2 is a block diagram showing the structure of the is communication receiving apparatus according to the embodiment of the present invention.

The communication receiving apparatus shown in FIG. 2 has an antenna 1 from which a radio frequency (RF) signal as a transmitted signal is received. The antenna 1 is connected to an RF portion 2. The RF portion 2 mixes down the received RF signal to an intermediate frequency (IF) signal as an analog signal. The RF portion 2 is connected to an automatic gain controlling circuit portion 9 as a gain controlling apparatus.

The automatic gain controlling circuit portion 9 has a gain varying unit 3. The gain varying unit 3 is connected to the RF portion 2. The gain varying unit 3 controls the variable amount of the IF signal received from the RF portion 2 so as to keep the IF signal in a predetermined level. The gain varying portion 3 is connected to an RSSI circuit 4. The RSSI circuit 4 converts the received RF signal into a DC component and detects the electric field intensity of the received signal. In addition, the gain varying portion 3 is connected to an A/D converting unit 5. The A/D converting unit 5 receives the IF signal kept in the predetermined level from the gain varying unit 3, despreads the IF signal with a predetermined spread code, and converts the despreaded signal into a digital signal. In this example, the RSSI circuit 4 receives the signal from an input portion of the gain varying unit 3 and detects the electric field intensity of the received signal. Alternatively, when the electric field intensity of the received signal is weak, the RSSI circuit 4 may receive the signal from an output portion of the gain varying unit 3 and detects the electric field intensity of the received signal.

The A/D converting unit 5 is composed of an despread circuit 5a and an A/D converting circuit 5b. The despread circuit 5a multiplies a predetermined spread code by the IF signal kept in the predetermined level. The A/D converting circuit 5b converts orthogonal signal components I and Q as a base band signal received from the despread circuit 5a into respective digital signal components. The A/D converter 5 performs the sum-of-square calculation for each of the orthogonal signal components I and Q and outputs the calculated results. The A/D converting unit 5 is connected to an averaging process circuit 6. The averaging process circuit 6 averages the digital signal received from the A/D converting unit 5 in a predetermined time period T and controls the variable amount of the gain varying unit 3 so that the digital signal converges at an N-bit digital value that represents a particular amplitude level.

The RSSI circuit 4 is connected to a level determining unit 8. The level determining unit 8 determines the electric field intensity of the received signal detected by the RSSI circuit 4 corresponding to predetermined threshold values and controls the variable amount of the gain varying unit 3 corresponding to the level. An RSSI controlling portion is composed of the level determining unit 8 and the RSSI circuit 4.

The automatic gain controlling circuit portion 9 is composed of the gain varying unit 3, the RSSI circuit 4, the A/D converting unit 5, the averaging process circuit 6, and the level determining unit 8.

The automatic gain controlling circuit portion 9 is connected to a base band (BB) portion 7. The BB portion 7 has a demodulating unit that demodulates the RF signal that has been modulated on the transmitting side.

Next, with reference to the accompanying drawings, the operation of the communication receiving apparatus according to the embodiment of the present invention will be described.

An RF signal received from the antenna 1 is supplied to the RF portion 2. The RF portion 2 mixes down the RF signal to an IF signal. The automatic gain controlling circuit portion 9 controls the received RF signal in a predetermined level.

In other words, the automatic gain controlling circuit portion 9 controls the gain in two staged loops.

In the first staged loop, the RSSI circuit 4 converts the RF signal into a DC component, detects the electric field intensity of the received signal, and controls the variable amount of the gain varying unit 3 corresponding to the detected level of the electric field intensity of the received signal.

In for example a CDMA mobile communication system of which a plurality of user use the same frequency, the level of the received signal fluctuates corresponding to the number of users of communication receiving apparatuses. Thus, as shown in FIG. 1, the conventional RSSI circuit controls the conventional gain varying unit so that the variable amount thereof is proportional to the level of the received signal. However, since the variable amount of the conventional gain varying unit is controlled corresponding to information of the preceding slot of the received signal, when the level of the received signal largely fluctuates, the automatic gain controlling circuit excessively varies the variable amount. Thus, the automatic gain controlling circuit may not operate corresponding to the abrupt fluctuation of the level of the received signal.

Figure 3:
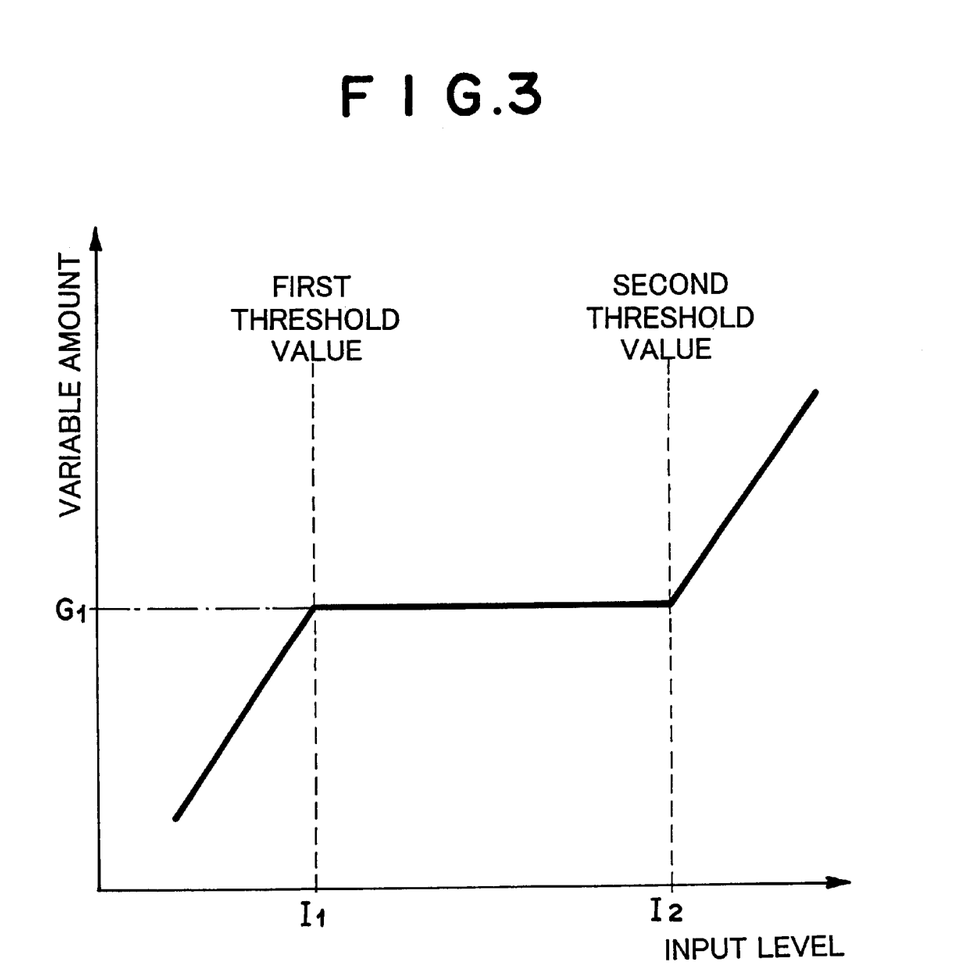
FIG. 3 is a graph showing threshold values in the relation between the input level and the variable amount of the gain of a level determining unit according to the embodiment of the present invention.

To solve such a problem, in consideration of the large fluctuation of the level of the received signal due to the increase/decrease of the number of users, as shown in FIG. 3, the level determining unit 8 controls the variable amount of the gain varying unit 3 corresponding to the input level of the received signal with two threshold values. In this example, the first threshold value is applied when the input level is I1 that is a weak level. In contrast, the second threshold value is applied when the input level is I2 that is larger than the input level I1. The gain of the gain variable amount is denoted by G1. The difference between the input level I1 and the input level I2 is the variable amount of a predetermined gain.

The gain-controlled signal is converted into a digital signal by the A/D converting unit 5. However, the input level of the A/D converting unit 5 has been predetermined. Thus, when the level of the received signal is too large, it gets clipped. In contrast, when the level of the input signal is too small, it is affected by quantizing noise and thereby the sensitivity of the received signal may deteriorate. To solve such problems, the RSSI circuit 4 controls the variable amount of the gain varying unit 3 so that the input level of the A/D converting unit 5 exceeds a predetermining value.

In the second staged loop, the averaging process circuit 6 averages the digital signal converted by the A/D converting unit 5 in a predetermined time period T. The variable amount of the gain varying unit 3 is controlled so that the average value converges at an N-bit digital value that represents a predetermined amplitude level.

Figure 4:
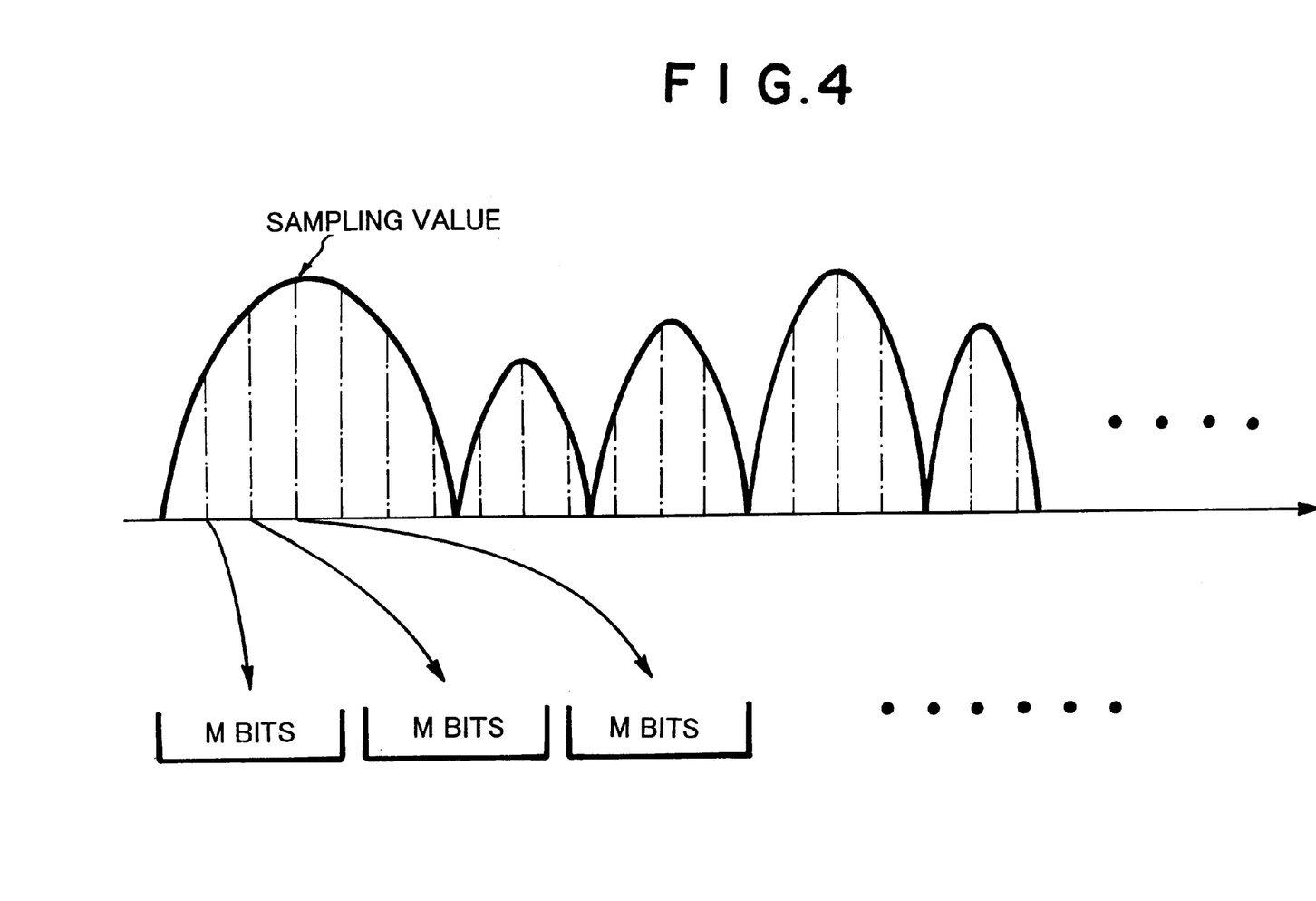
FIG. 4 is a timing chart showing a sampling process of an A/D converter according to the embodiment of the present invention.
Figure 5:
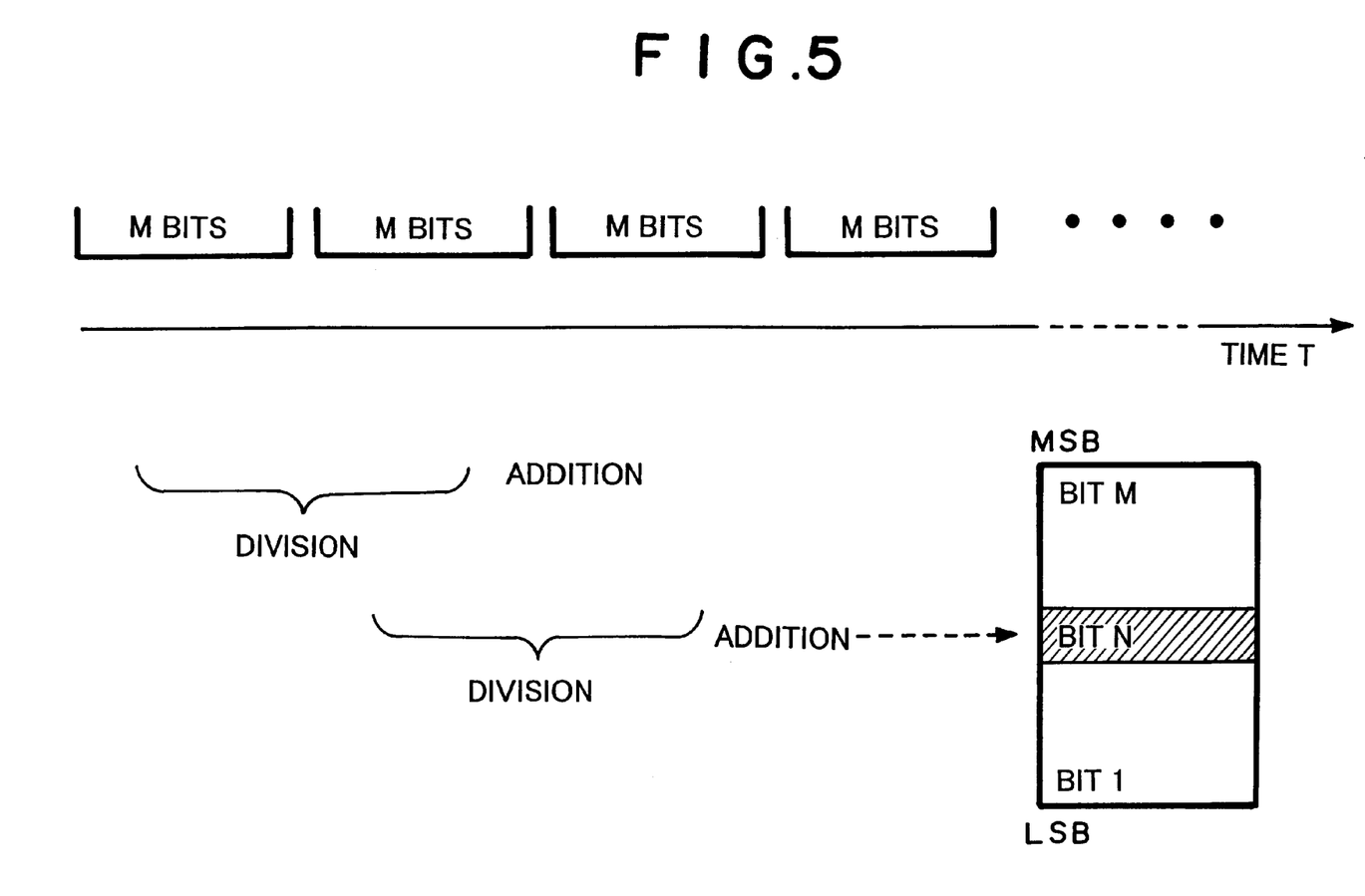
FIG. 5 is a schematic diagram for explaining an averaging process of an averaging process circuit according to the embodiment of the present invention.

In the second staged loop, the level of the signal supplied to the A/D converting unit 5 is finely adjusted. In other words, as shown in FIG. 4, a digital signal converted by the A/D converting unit 5 is converted into an M-bit digital signal having a level X for each sampling value (sampling time period). The resultant digital signals are averaged in a predetermined time period. As an example of the averaging method, with each sampling value in the predetermined time period T, two sampling values are added and the resultant value is divided into two portions as shown in FIG. 5. The obtained value is added to the next sampling value and the resultant value is divided into two portions. By repeating the same operation in the predetermined time period T, an average value is obtained.

In addition, the variable amount of the gain varying unit 3 is controlled so that the obtained average value converges at an N-bit digital signal that represents the predetermined amplitude level. The number of bits N is selected so that the digital signal does not get clipped and is not affected by quantizing noise when the most significant bit is M and the least significant bit thereof is 1.

The demodulating unit of the BB portion 7 demodulates the digital signal that has been modulated on the transmitting side and that has been gain-controlled in the two staged loops of the automatic gain controlling circuit portion 9.

As described above, the first staged loop of the RSSI that coarsely controls the level of the signal received from the RSSI and the second-staged loop of the averaging process circuit that averages the digital signal received from the A/D converting unit 5 and finely adjusts the gain varying unit 3 suppress the automatic gain controlling circuit from excessively operating against the fluctuation of the level of the received signal. Thus, with the two staged loops of the automatic gain controlling circuit portion, the sensitivity of the received signal can be prevented from excessively deteriorating.

Since the second staged loop of the averaging process circuit that averages the signal received from the A/D converting unit 5 and thereby finely adjusts the variable amount of the gain varying unit 3 is provided, it is not necessary to precisely control the level of the signal received from the RSSI. In addition, the automatic gain controlling circuit portion can properly operate against the abrupt fluctuation of the level.

In a communication system of which many users use the same frequency, when the number of users of communication receiving apparatuses is large, since the level of the received signal does not largely fluctuate corresponding to the increase/decrease of the number of users. Thus, the sensitivity of the received signal is not largely affected. In contrast, when the number of users of the communication receiving apparatuses is small, the level of the received signal largely fluctuates corresponding to the increase/decrease of the number of users and to the use environment. Thus, the sensitivity of the received signal may largely deteriorate. However, in consideration of the large fluctuation of the level of the received signal corresponding to the increase/decrease of the number of users, the level determining unit 8 having two threshold values is used. Thus, corresponding to the level of the received signal, the variable amount of the gain varying unit 3 can be controlled. Thus, the level of the received signal can be suppressed from fluctuating against the increase/decrease of the number of users and the use environment.

In the above-described embodiment, the gain varying unit 3 is disposed in the automatic gain controlling circuit portion 9. Alternatively, the gain varying unit 3 may be disposed in the RF portion 2.

According to the present invention, the level of the received signal is coarsely adjusted by the RSSI. In addition, the digital signal converted by the A/D converting unit is averaged and thereby the gain varying unit is finely adjusted so as to control the variable amount of the gain. Thus, the automatic gain controlling circuit portion can be prevented from excessively operating against the fluctuation of the level of the received signal. Consequently, the sensitivity of the received signal can be prevented from excessively deteriorating.

In addition, the signal converted by the A/D converting unit is averaged. Thus, the variable amount of the gain varying unit can be finely adjusted. Consequently, it is not necessary to precisely control the level of the signal received from the RSSI. In addition, the automatic gain controlling circuit portion can properly operate against the abrupt fluctuation of the level of the received signal.

Moreover, in a communication system of which a plurality of users use the same frequency, in consideration of the large fluctuation of the level of the received signal corresponding to the increase/decrease of the number of users, the level determining unit having two threshold values is used. Thus, the variable amount of the gain varying unit can be controlled corresponding to the level of the received signal. Consequently, the fluctuation of the level due to the increase/decrease of the number of users and the use environment can be suppressed.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. An automatic gain controlling method for causing an RSSI (Receive Signal Strength Indicator) circuit to detect an electric field intensity of a received signal supplied to a demodulating unit so as to control the variable amount of gain of a radio frequency signal and output a signal at a predetermined level, the method comprising the steps of:

(a) detecting the electric field intensity of the received signal (b) using a first staged loop to provide coarse adjustment of the variable amount of the gain corresponding to the detected electric field intensity; and (c) independently of the first staged loop, step (b), converting the received signal into a digital signal after using a second staged loop to provide fine adjustment of the variable amount of the gain so that the average value of the digital signal converges to a predetermined amplitude level.

2. The automatic gain controlling method as set forth in claim 1, wherein when the variable amount of the gain is controlled corresponding to the electric field intensity, the variable amount of the gain is almost constant in a predetermined level range of the received signal.

3. The automatic gain controlling method as set forth in claim 2, wherein when the digital signal is averaged, a signal detected in each predetermined time period is converted into a digital signal within a predetermined number of bits corresponding to almost the same level.

4. The automatic gain controlling method as set forth in claim 2, wherein the digital signals are averaged in a predetermined time period.

5. The automatic gain controlling method as set forth in claim 1, wherein when the digital signal is averaged, a signal detected in each predetermined time period is converted into a digital signal with a predetermined number of bits corresponding to almost the same level.

6. The automatic gain controlling method as set forth in claim 5, wherein the digital signals are averaged in a predetermined time period.

7. The automatic gain controlling method as set forth in claim 1, wherein the digital signals are averaged in a predetermined time period.

8. An automatic gain controlling apparatus, comprising: a gain varying unit for keeping a received signal in a predetermined level;

an analog/digital converting unit for converting the signal kept in the predetermined level by said gain varying unit into a digital signal;

an RSSI controlling portion in a first staged loop, for detecting the electric field intensity of the received signal and providing coarse adjustment of the variable amount that causes said gain varying unit to vary the received signal in said predetermined level corresponding to the detected electric field intensity; and an averaging process circuit in a second staged loop independent of the first staged loop, for averaging the level of the digital signal received from said analog/digital converting unit and providing fine adjustment of the variable amount that causes said gain varying unit to vary the signal in the predetermined level so as to converge the digital signal received from said analog/digital converting unit at a predetermined amplitude level.

9. The automatic gain controlling apparatus as set forth in claim 8, wherein said RSSI controlling portion has:
an RSSI circuit for detecting the electric field intensity of the received signal; and
a level determining unit having at least one threshold value for setting a range of which the conversion amount of the gain is almost constant in a predetermined range of the electric field intensity detected by said RSSI circuit.

10. The automatic gain controlling apparatus as set forth in claim 9, wherein said averaging process circuit converts a signal detected in each predetermined time period into a digital signal within a predetermined number of bits corresponding to almost the same level and averages each of bits of the digital signals.

11. The automatic gain controlling apparatus as set forth in one of claim 9, wherein said averaging process circuit averages the number of bits of the digital signals in a predetermined time period.

12. The automatic gain controlling apparatus as set forth in claim 8, wherein said averaging process circuit converts a signal detected in each predetermined time period into a digital signal with a predetermined number of bits corresponding to almost the same level and averages each of bits of the digital signals.

13. The automatic gain controlling apparatus as set forth in one of claim 12.

wherein said averaging process circuit averages the number of bits of the digital signals in a predetermined time period.

14. The automatic gain controlling apparatus as set forth in one of claim 8, wherein said averaging process circuit averages the number of bits of the digital signals in a predetermined time period.

15. A communication receiving apparatus, comprising:

a radio frequency receiving portion for receiving a transmitted signal;

an automatic gain controlling apparatus for converting the signal received from said radio frequency receiving portion into a digital signal, said automatic gain controlling apparatus having:

a gain varying unit for keeping a received signal in a predetermined level, an analog/digital converting unit for converting the signal kept in the predetermined level by said gain varying unit into a digital signal, an RSSI controlling portion in a first staged loop, for detecting the electric field intensity of the received signal and providing coarse adjustment of the variable amount that causes said gain varying unit to vary the received signal in said predetermined level corresponding to the detected electric field intensity, and an averaging process circuit in a second staged loop independent of the first staged loop, for averaging the level of the digital signal received from said analog/digital converting unit and providing fine adjustment of the variable amount that causes said gain varying unit to vary the signal in the predetermined level so as to converge the digital signal received from said analog/digital converting unit at a predetermined amplitude level; and a base band portion for demodulating a digital signal that has been modulated on a transmitting side and received from said automatic gain controlling apparatus to original information.

16. The communication receiving apparatus as set forth in claim 15,
wherein said RSSI controlling portion has:
an RSSI circuit for detecting the electric field intensity of the received signal; and
a level determining unit having at least one threshold value for setting a range of which the conversion amount of the gain is almost constant in a predetermined range of the electric field intensity detected by said RSSI circuit.

17. The communication receiving apparatus as set forth in claim 16,
wherein said averaging process circuit averages the number of bits of the digital signals in a predetermined time period.

18. The communication receiving apparatus as set forth in claim 15,
wherein said averaging process circuit converts a signal detected in each predetermined time period into a digital signal with a predetermined number of bits corresponding to almost the same level and averages each of bits of the digital signals.

19. The communication receiving apparatus as set forth in claim 15,
wherein said averaging process circuit averages the number of bits of the digital signals in a predetermined time period.

\* \* \* \* \*